United States Patent
Van Veldhoven et al.

(10) Patent No.: US 7,236,594 B2
(45) Date of Patent: Jun. 26, 2007

(54) RANDOM GENERATOR DESCRIPTION

(75) Inventors: Robert Henrikus Margaretha Van Veldhoven, Eindhoven (NL); Gian Hoogzaad, Delft (NL)

(73) Assignee: NXP B.V., Eindhoven (NL)

( * ) Notice: Subject to any disclaimer, the term of this patent is extended or adjusted under 35 U.S.C. 154(b) by 804 days.

(21) Appl. No.: 10/188,139

(22) Filed: Jul. 2, 2002

(65) Prior Publication Data

US 2003/0053626 A1   Mar. 20, 2003

(30) Foreign Application Priority Data

Jul. 5, 2001   (EP) ................................. 01202588

(51) Int. Cl.
*H04L 9/00* (2006.01)
(52) U.S. Cl. .................. 380/46; 380/263; 380/268
(58) Field of Classification Search ................ 380/263, 380/268
See application file for complete search history.

(56) References Cited

U.S. PATENT DOCUMENTS 4,911,552 A * 3/1990 Kurashige et al. ........ 348/224.1
6,414,558 B1 * 7/2002 Ryan et al. .................. 331/78

* cited by examiner

*Primary Examiner*—Gilberto Barron, Jr.
*Assistant Examiner*—Jung Kim
(74) *Attorney, Agent, or Firm*—Peter Zawilski

(57) ABSTRACT

A pseudo random generator comprising a shift register comprising a first flip flop (F0) and n further flip-flops (F1 . . . Fn) each flip-flop (F0) having a D input, a non-inverting output, an inverting output, and a common clock (fclk) input and the first flip-flop (F0) having a set input, each of the non-inverting outputs being connected via a NOR gate (10) to the set input of the first flip-flop (F0) and each of the non-inverting outputs of the flip-flops (F0 . . . Fn) being connected to the input of the first flip-flop (F0) via an XOR gate (11), characterised in that the generator comprises at least one additional logic gate (13, 14, 15; 17, 18, 19) including at least one additional flip-flop (14;18).

The extra logic gates may comprise gated to toggle between the inverting end and the non-inverting outputs, or to generate an extra '0' at the output or to chop, preferably randomly, the input signal.

8 Claims, 4 Drawing Sheets

RANDOM GENERATOR DESCRIPTION

The present invention relates to a random generator and particularly to a pseudo random generator.

A one-dimensional pseudo-random generator generates a fixed bit pattern that has a low as possible auto-correlation.

A typical pseudo random generator comprises a shift register, ie a series of cascaded flip-flops, connected to a common clock input, with the outputs connected via a NOR gate to set the input of the first flip-flop on start-up, and the outputs of the last two flip-flops connected to the input of the first via an XOR gate.

Such a generator has only an odd number of states, and there is a forbidden state when all outputs are zero, so that if the generator is started up in a non-forbidden state then it generates a loop of 26-1 states sequentially in pseudo random order, and thus the output is not DC free, ie it does not have equal numbers of zeros and ones.

One aspect of the present invention provides a pseudo random generator comprising a shift register comprising a first flip flop and n further flip-flops each flip-flop having a D input, a non-inverting output, an inverting output, and a common clock input and the first flip-flop having a set input, each of the non-inverting outputs being connected via a NOR gate to the set input of the first flip-flop and each of the non-inverting outputs of the flip-flops being connected to the input of the first flip-flop via an XOR gate, characterised in that the generator comprises at least one additional logic gate including at least one additional flip-flop.

In one embodiment the components are connected to toggle between the inverting and the non-inverting outputs of the nth flip-flop. Preferably the extra gates comprises an AND gate with one input connected to the common clock and another input connected to the output of the NOR gate and an output of the AND gate being connected to a clock input of an additional flip-flop which has its inverting output connected to the input and its non-inverting output connected to one input of an XOR gate, which has another inout connected with the output of the shift register. The flip-flips are typically D-type flip-flops.

This simulates a DC free spectrum by switching between inverting and non-inverting outputs after each sequence of 26-1 codes. Performance can be improved by using more pseudo random states and this puts more discrete frequencies at the output and spreads the output better over the signal band. The amplitude and the relative period are smaller. In the ideal case the amplitude decreases with the roof of $2^n-\frac{1}{2}$.

A second aspect of the invention provides a pseudo random generator comprising a shift register comprising n flip-flops, each having an input, a non-inverting output, an inverting output, and a common clock input, with the outputs connected via a NOR gate to the set input of the first flip-flop, and the outputs of the nth and (n−1)th flip-flops connected to inputs of the first flip-flop via an XOR gate, characterised by means to generate an additional '0' at the output.

This can be implemented by connecting the non-inverting outputs of each flip-flop via a first AND gate to the input of an extra flip-flop, connecting the inverting output of the extra flip-flop to one input of a second AND gate the other input of which is connected to the clock pulse, and connecting the output of the second AND gate each of the flip-flops of the shift register via respective additional AND gates provided at the inputs to each of the flip-flops of the shift register. This does not hold for all pseudo random generators.

A third aspect provides a pseudo random generator comprising a shift register comprising n flip-flops, each having an input, a non-inverting output, an inverting output, and a common clock input, with the outputs connected via a NOR gate to the set input of the first flip-flop, and the outputs of the nth and (n−1)th flip-flops connected to inputs of the first flip-flop via an XOR gate characterised by means to chop the input signal.

This can be used to reduce low frequency noise and offset in the signal band of interest, because they can be chopped to a higher frequency out of the signal band. However distortion can mean that the signal cannot be chopped at a high enough frequency to remove the low frequency noise and offset from the signal band. The maximum chopping frequency available is half the sample rate fs and therefore input signals with frequency ½ or ¼ or any even division of the sample rate fs cannot be handled correctly.

Preferably the signal chopping means is arranged to chop the input signal randomly.

Random chopping serves to minimise the correlation between the input signal and the chopping sequence.

The offset is not one discrete tone but is spread over the pseudo random frequencies whereas in ordinary chopping the integrated noise and offset remain the same. This is particularly useful in an A/D converter. However, the sequences are not entirely DC free since it is undesirable that one chop state occurs more often than the other, and long strings of '1's or '0's tend to be present and converting for a long time in one chop state is undesirable for the offset measurement.

The improvement in decorrelation also helps to reduce interference between the chop frequency and the input signal which otherwise results in unwanted mixed frequency components.

A fourth aspect of the present invention provides a pseudo random generator comprising a shift register comprising n flip-flops, each having an input, a non-inverting output, an inverting output, and a common clock input, with the outputs connected via a NOR gate to the set input of the first flip-flop, and the outputs of the nth and (n−1)th flip-flops connected to inputs of the first flip-flop via an XOR gate charaterised by means to supply an input clock pulse for the shift register of a first predetermined frequency and a frequency modulator operating at a second frequency, wherein the first frequency is the output frequency divided by an even integral number 2n and the modulating frequency is substantially the same as the output frequency.

This provides freedom in the modulation depth of the pseudo random output sequence.

Preferably the first frequency is one quarter the sample rate, and the second, modulating, frequency is approximately equal to one half the sample rate.

When the generator outputs a '0' then the subsequence of chop states is X/Xnot. When the generator outputs a>1' then the subsequence of chop states is Xnot/X.

Effectively the pseudo random output is modulated by means of an exclusive or gate and the generator is a biphase pseudo random generator that is short term DC free.

All aspects of the invention may be implemented in hardware or software, and thus the invention also provides software which simulates the generators of the first to fourth aspects of the invention, a computer programmed with such software and such software stored on computer media such as discs and tapes.

It will be appreciated that any references to specific types of logic gates are intended to include combinations of other types of logic gates which perform equivalent functions, as would be evident to a person skilled in the art.

For a better understanding of the present invention, and to show how the same may be carried into effect, reference will now be made to the accompanying drawings, in which.

Figure 1:
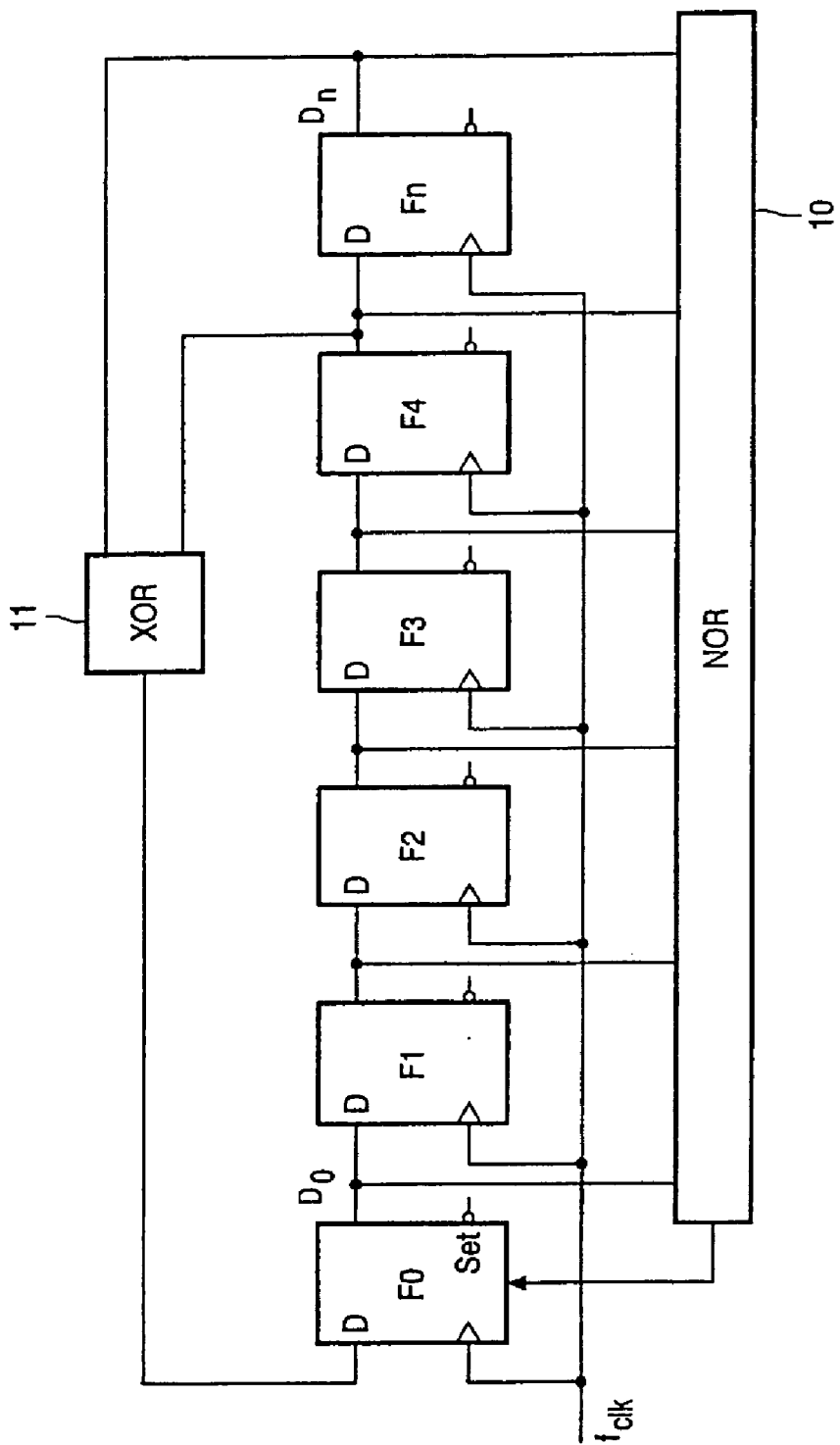
FIG. 1 is a circuit diagram of a known pseudo random generator which exhibits DC elements.

In FIG. 1 a known pseudo random generator is shown. The known generator comprises a series of n D-type flip-flops $0, 1, 2 \ldots, n$. Each flip-flop has a clock input fclk and a D input, together with a non-inverting output and an inverting output. The non-inverting output of each flip-flop is connected to the D input of the subsequent flip-flop and is also connected as an input to a NOR gate 10. The output of NOR gate 10 is connected to the set input of the first flip-flop 0. This sets the first flip-flop on start up of the generator to ensure good start up behaviour. The output of the nth flip-flop and the output of the n–1th flip-flop are each connected to respective inputs of an XOR gate 11, the output of which is connected to the D input of the first flip-flop 0. The output of this generator will always have a DC component because it has only an odd number of states.

Figure 2:
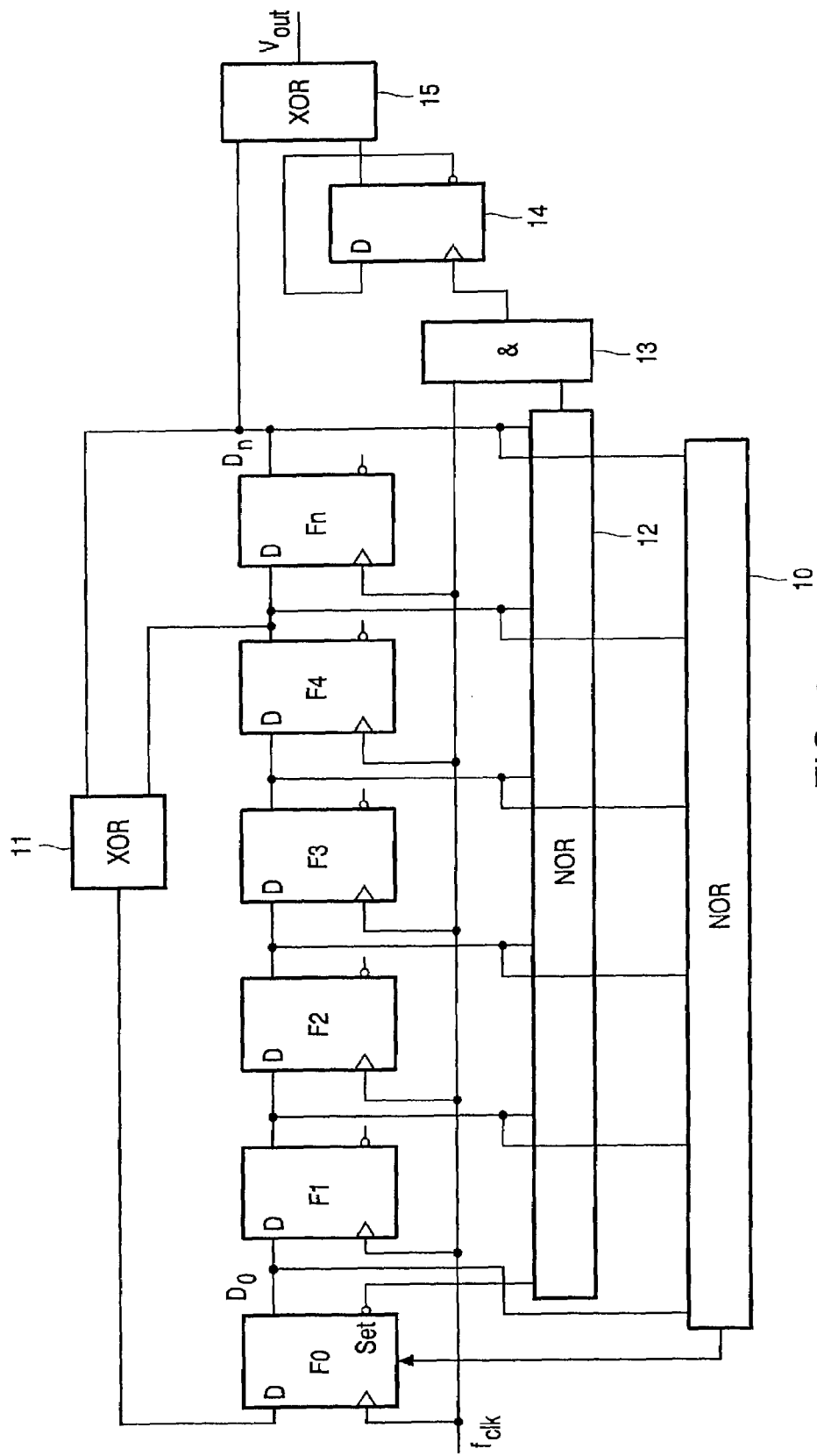
FIG. 2 is a circuit diagram of one embodiment of the present invention.

In FIG. 2 the pseudo random generator of FIG. 1 is adapted according to the invention by the addition of shown with extra gates to make it DC free. The extra gates toggle between inverting and non-inverting outputs after each sequence of $2^n-1$ codes. The extra gates comprise a second NOR gate 12, an additional AND gate 13, an additional flip-flop 14, and a second XOR gate 15. The second NOR gate 12 receives signals from the inverting output of the first flip-flop F0, and from the non-inverting outputs of the other flip-flops. Its output forms the input to the additional AND gate 13. The output of the additional AND gate 13 forms the clock input of the additional flip-flop 14, the inverting output of which is connected to its own input and the non-inverting output forms one input to a second XOR gate 14. The other input of the additional XOR gate 15 is the output of the last flip-flop Fn.

The performance of this generator can be enhanced by using more pseudo random states. This gives more discrete frequencies in the output of the generator so that the output signal is spread better over the signal band. The amplitude of the output signals will also be lower because as the sequence is longer then the relative period is smaller. Typically in the ideal case (of white spreading) the amplitude will decrease with the root of $2^n-\frac{1}{2}$.

Figure 3:
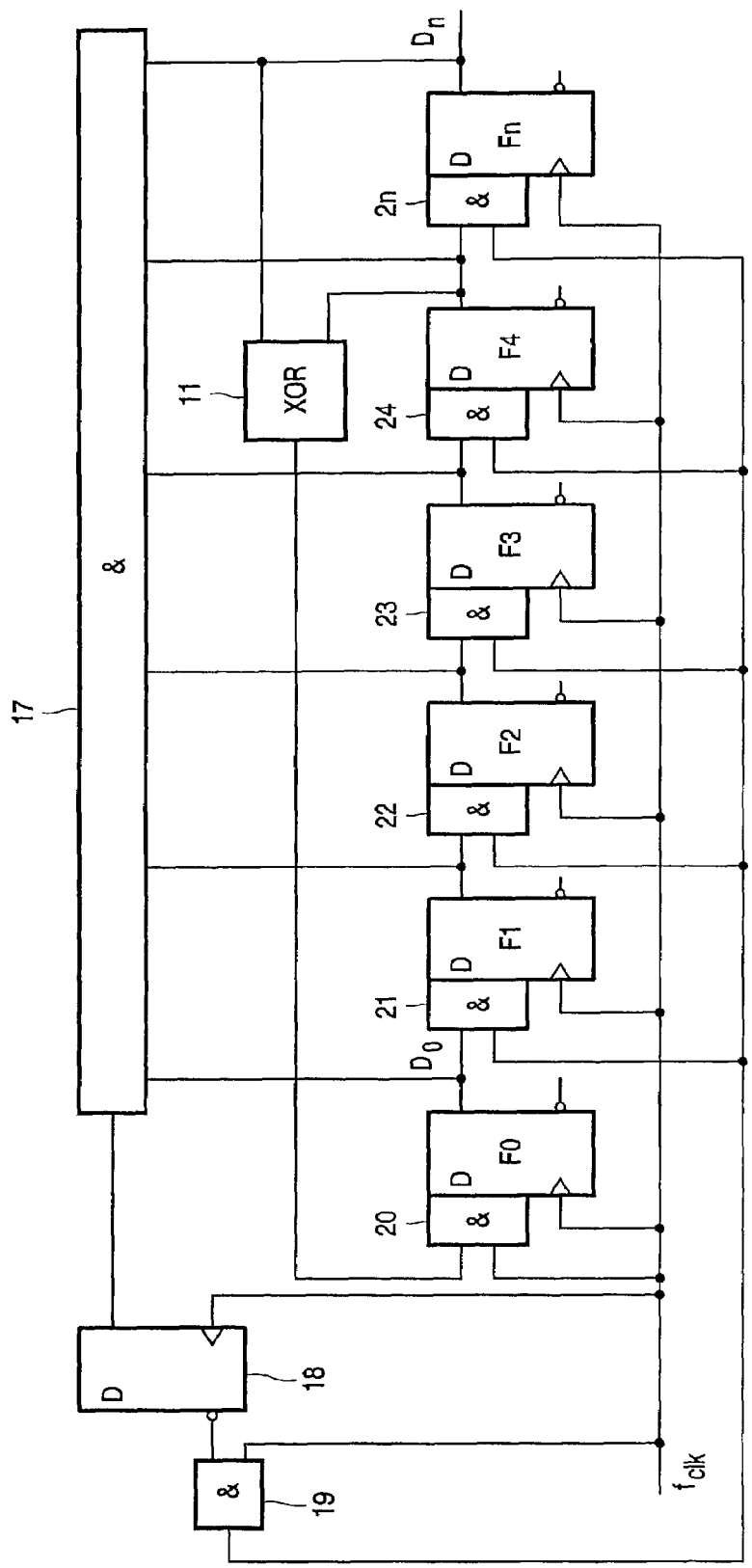
FIG. 3 is a circuit diagram of a second embodiment of the present invention.

In FIG. 3 a circuit according to a second embodiment of the invention is shown. This circuit effectively generates an extra '0' at the output, making use of the fact that the only code not generated by the shift register is all zeros. However this does not work for all pseudo random generators of the type shown and described with reference to FIG. 1.

(The circuit of FIG. 3 is shown without the NOR gate 10 (of FIG. 2) for simplicity but this is nevertheless needed). The circuit of this embodiment has an extra AND gate 20 21 22 . . . 2n at the D input of each of the flip-flops F0 to Fn respectively. The outputs D0 to Dn of the flip-flops F0 to Fn are all connected as inputs to an AND gate 17. The output of the AND gate 17 forms the D input of a further flip-flop 18, which is clocked by the common clock pulse fclk, and has its inverting output connected as one input to a second AND gate 19. A second input to AND gate 19 is connected to the clock line fclk. The output of AND gate 19 forms the input to each of the extra AND gates 20 21 22 . . . 2n at the inputs of the shift register flip-flops F0,F1,F2, . . . Fn.

Figure 4:
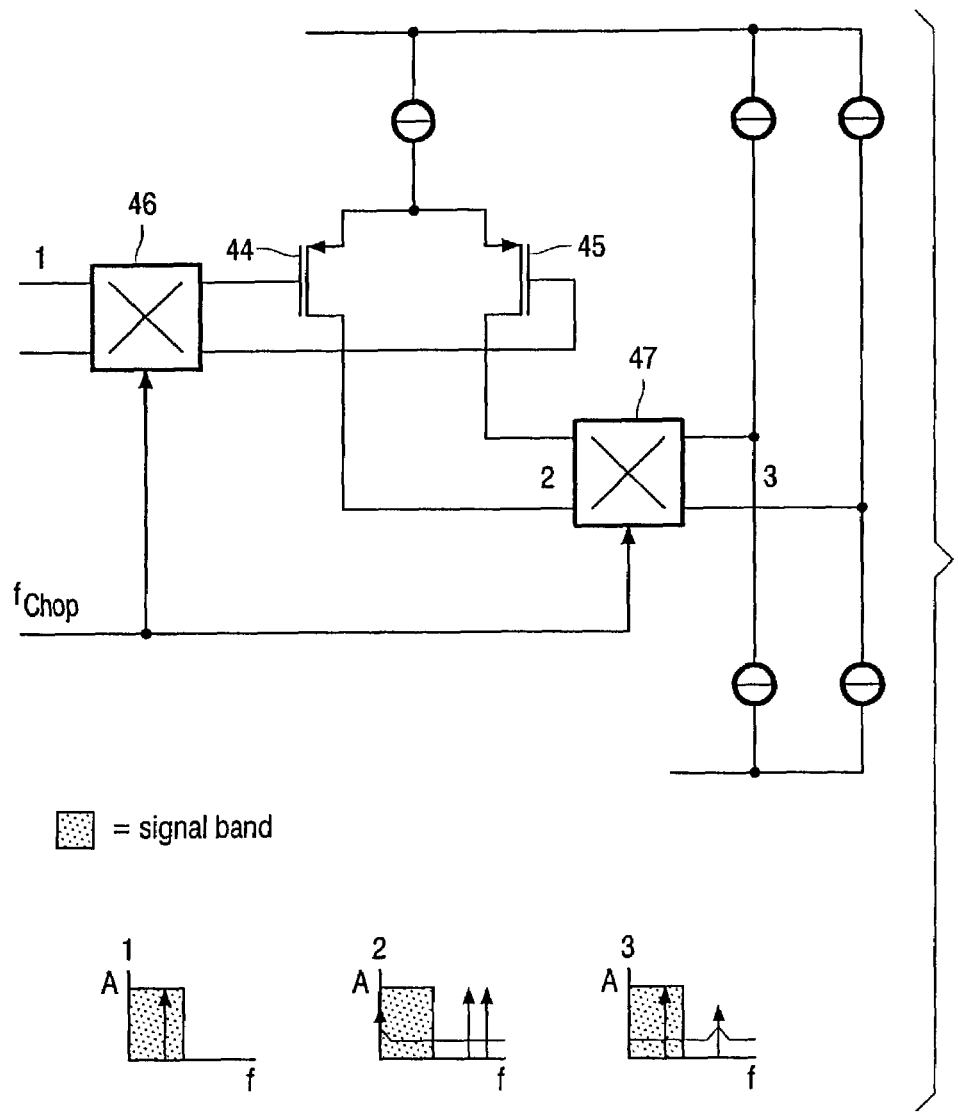
FIG. 4 is a circuit diagram of a third embodiment of the present invention.

FIG. 4 shows a circuit according to a further embodiment of the invention in which chopping is used to reduce low frequency (1/f) noise and offset in the signal band of interest. The low frequency noise and offset are chopped to a higher frequency out of the signal band as illustrated in FIG. 4. The signal band is represented by the shaded rectangle. The input signal 1 is chopped to the chopping frequency fchop in chopper 46 and then the offset and the low frequency noise are added to the chopped input signal via Pmos transistors 44 and 45 and chopped again in chopper 47 to produce the signal shown at 3. This process chops the original input signal to the signal frequency, but the offset and the 1/f noise is chopped out of the signal band as shown at 3 in FIG. 4, In the case where distortion causes only a shift in frequency, within the signal band, of the 1/f noise and the offset, rather than a shift out of the signal band, then random chopping may be used. This spreads the offset over the random frequencies, and serves to decorrelate the input signal and the chop frequency to avoid the unwanted mixed frequency components which otherwise arise.

This is particularly applicable to analogue to digital converters; chopping is used to measure the offset in the residue path and calibrate it to zero and the use of random chopping serves to minimise the correlation between the input signal and the chopping sequence. According to one embodiment of the invention this is advantageously done by running a pseudo random generator at fs/4 and modulating the output with a signal at fs/2. This can be done using the following software sequence in (VHDL).

```
process (clock)
begin
if rising_edge (clock) then
halfclock ≦ not(halfclock);
and if;
end process;
------------------------------------------------------------------------
pr: process (clock)
begin
if rising_edge (clock) then
if sr11='0' and sr10='0' and sr9='0' and sr8='0' and sr7='0' and sr6='0' and sr5='0'
             and sr4='0' and sr3='0' and sr2='0' and sr1='0'
then
sr1 ≦ '1';
chopsub ≦ '0' ;
```

```
elsif halfclock = '1' then
sr2 ≦ sr1
sr3 ≦ sr2
sr4 ≦ sr3
sr5 ≦ sr4
sr6 ≦ sr5
sr7 ≦ sr6
sr8 ≦ sr7
sr9 ≦ sr8
sr10 ≦ sr9
sr11 ≦ sr10
sr1 ≦ sr11 xor sr9
chopsub ≦ sr11
        end if;
end if;
end process pr;
------------------------------------------------------------------
chp:process(clock)
begin
if rising_edge(clock) then
chop≦chopsub xor halfclock;
end if;
end process chp;
------------------------------------------------------------------
```

'Sr1 through sr11 form an 11-bit shift-register, 'halfclock' is an fs/2 signal which modulates the pseudo random output signal 'chopsub' by means of an exclusive or. The result is a biphase pseudo random generator with output signal 'chop' that is short term DC free.

sr2<sr1

It can also be done using hardware as will be evident to a person skilled in the art.

The invention claimed is:

1. A pseudo random generator comprising a shift register comprising:
   first flip flop (F0);
   further flip-flops (F1 . . . Fn);
       each flip-flop (Fx) having a D input, a non-inverting output, an inverting output, and a common clock ($f_{clk}$) input; and
       the first flip-flop (F0) having a set input, each of the non-inverting outputs being connected via a NOR gate (10) to the set input of the first flip-flop (F0) and each of the non-inverting outputs of the flip-flops (F0 . . . Fn) being connected to the input of the first flip-flop (F0) via an XOR gate (11), further comprising at least one additional logic gate (13, 14, 15; 17, 18, 19) connected to at least one additional non-serial flip-flop (14; 18);
   wherein the at least one additional logic gate (13, 14, 15; 17, 18, 19) includes gates connected to the outputs of the flip-flops (F0 . . . Fn) to toggle between the inverting and the non-inverting outputs of the nth flip-flop; and
   wherein the at least one additional logic gate (13, 14, 15; 17, 18, 19) further includes an AND gate (13) with one input connected to the common clock ($f_{clk}$) and another input connected to the output of the NOR gate (12) and an output of the AND gate (13) being connected to a clock input of the at least one additional non-serial flip-flop (14) which has its inverting output connected to its D input and its non-inverting output connected to one input of an XOR gate (15).

2. A pseudo random generator according to claim 1, wherein each of the flip-flops (F0 . . . Fn) is a D-type flip-flop.

3. A pseudo random generator according to claim 1, further comprising means to generate an extra logic 0 at the output of the generator.

4. A pseudo random generator according to claim 1, further comprising means to chop the input signal.

5. A pseudo random generator according to claim 4 wherein the chop means comprises means to randomly chop the input signal.

6. A pseudo random generator comprising a shift register comprising:
   first flip flop (F0);
   further flip-flops (F1 . . . Fn);
       each flip-flop (Fx) having a D input, a non-inverting output, an inverting output, and a common clock ($f_{clk}$) input; and
       the first flip-flop (F0) having a set input, each of the non-inverting outputs being connected via a NOR gate (10) to the set input of the first flip-flop (F0) and each of the non-inverting outputs of the flip-flops (F0 . . . Fn) being connected to the input of the first flip-flop (F0) via an XOR gate (11), further comprising at least one additional logic gate (13, 14, 15; 17, 18, 19) connected to at least one additional non-serial flip-flop (14; 18); and
   means to generate an extra logic 0 at the output of the generator;
       wherein the extra logic 0 generating means comprises means connecting the non-inverting outputs of each flip-flop (F0 . . .Fn) via a first AND gate (17) to the input of the additional flip-flop (18), connecting the inverting output of the additional flip-flop (18) to one input of a second AND gate (19) the other input of which is connected to the clock pulse ($f_{clk}$), and connecting the output of the second AND gate (19) to each of the flip-flops (F0 . . . Fn) of the shift register via respective additional AND gates (20 . . . 2n) provided at the inputs to each of the flip-flops (F0 . . . Fn) of the shift register.

7. A pseudo random generator comprising a shift register comprising:
   first flip flop (F0);
   further flip-flops (F1 . . . Fn);

each flip-flop (Fx) having a D input, a non-inverting output, an inverting output, and a common clock ($f_{clk}$) input; and the first flip-flop (F0) having a set input, each of the non-inverting outputs being connected via a NOR gate (10) to the set input of the first flip-flop (F0) and each of the non-inverting outputs of the flip-flops (F0 . . . Fn) being connected to the input of the first flip-flop (F0) via an XOR gate (11), further comprising at least one additional logic gate (13, 14, 15; 17, 18, 19) connected to at least one additional non-serial flip-flop (14; 18); and means to supply to the shift register an input clock pulse ($f_{clk}$) of a first predetermined frequency and a frequency modulator operating at a second frequency, wherein the first frequency is the output frequency divided by an even integral number 2n and the modulating frequency is substantially the same as the output frequency.

8. A pseudo random generator according to claim 7 wherein the first frequency is one quarter the sample rate, and the second, modulating, frequency is approximately equal to one half the sample rate.

* * * * *